US012690268B2

(12) United States Patent
Wang et al.

(10) Patent No.: US 12,690,268 B2
(45) Date of Patent: Jul. 21, 2026

(54) ARRAY SUBSTRATES AND DISPLAY PANELS

(71) Applicant: TCL China Star Optoelectronics Technology Co., Ltd., Shenzhen (CN)

(72) Inventors: He Wang, Shenzhen (CN); Dongming Su, Shenzhen (CN); Jiaming Peng, Shenzhen (CN); Guanshui Luo, Shenzhen (CN); Jiaojiao Shi, Shenzhen (CN); Ziran Li, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 401 days.

(21) Appl. No.: 18/373,336

(22) Filed: Sep. 27, 2023

(65) Prior Publication Data

US 2024/0266361 A1      Aug. 8, 2024

(30) Foreign Application Priority Data

Feb. 3, 2023    (CN) .......................... 202310123952.1

(51) Int. Cl.
H10D 86/60      (2025.01)
G02F 1/1362      (2006.01)
H10D 86/40      (2025.01)

(52) U.S. Cl.
CPC ....... H10D 86/60 (2025.01); G02F 1/136218 (2021.01); G02F 1/136222 (2021.01); G02F 1/136286 (2013.01); H10D 86/443 (2025.01)

(58) Field of Classification Search
None
See application file for complete search history.

(56) References Cited

U.S. PATENT DOCUMENTS

2023/0073626 A1* 3/2023 Du ....................... H10K 59/131

* cited by examiner

*Primary Examiner* — Anthony Ho

(57) ABSTRACT

Display panels and array substrates are provided. The array substrate includes a first base, a first metal layer disposed on the first base and including scanning lines, a second metal layer disposed on the first metal layer and including data lines, a third metal layer disposed on the second metal layer and including pixel electrodes, and a fourth metal layer disposed between the third metal layer and the second metal layer. The fourth metal layer includes a transparent shielding electrode in which at least one repair hole is formed. An orthographic projection of the repair hole on the first base overlaps a part of an orthographic projection of at least one of the data lines and the scanning lines on the first base.

20 Claims, 5 Drawing Sheets

ARRAY SUBSTRATES AND DISPLAY PANELS

CROSS-REFERENCE TO RELATED APPLICATION

This application claims the benefit of priority of Chinese Patent Application No. 202310123952.1, filed on Feb. 3, 2023, the contents of which are incorporated by reference as if fully set forth herein in their entirety.

TECHNICAL FIELD

The present disclosure relates to display technologies, and particularly to array substrates and display panels.

BACKGROUND

In a Transparent Storage capacity and Shielding Layer (TSS for short) pixel structure of an array substrate, a TSS transparent electrode layer overlapping a data line may shield an electric field of the data line, and a large transparent storage capacitance is formed between the TSS transparent electrode layer and a pixel electrode layer, so that the transmittance and the storage capacitance may be greatly improved. However, since the TSS transparent electrode layer is disposed to cover a metal line, such as the data line or the like, metal melt will be formed on a laser section during a laser repair process for the array substrate and may cause a short circuit between the TSS transparent electrode layer and the metal line, which may affect a repair success rate of the array substrate and reduce a repair yield of the array substrate.

SUMMARY

In view of the above, embodiments of the present disclosure provide array substrates. The array substrate includes a first base, a first metal layer disposed on the first base and including scanning lines, a second metal layer disposed on a side of the first metal layer and including data lines, a third metal layer disposed on a side of the second metal layer away from the first metal layer and including pixel electrodes, and a fourth metal layer disposed between the third metal layer and the second metal layer. The fourth metal layer includes a transparent shielding electrode in which at least one repair hole is formed. An orthographic projection of the repair hole on the first base overlaps a part of an orthographic projection of at least one of the data lines and the scanning lines on the first base.

Embodiments of the present disclosure also provide display panels. The display panel includes the above array substrate, a color filter substrate, and a liquid crystal sandwiched between the array substrate and the color filter substrate.

BRIEF DESCRIPTION OF THE DRAWINGS

In order to more clearly illustrate the technical solutions in the embodiments of the present disclosure, the drawings that need to be used in the description of the embodiments will be briefly introduced below. Obviously, the drawings in the following description are only some embodiments of the present disclosure. For those skilled in the art, other drawings may also be obtained based on these drawings without any creative effort.

DETAILED DESCRIPTION

Figure 1:
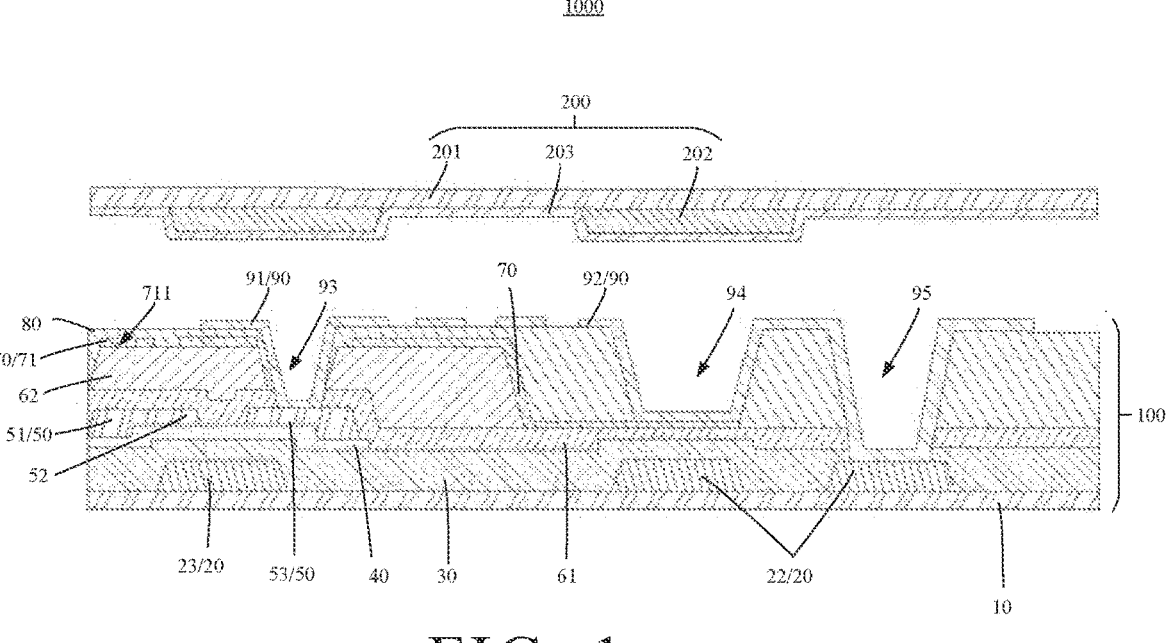
FIG. 1 is a sectional view of a display panel according to an embodiment of the present disclosure.

Some embodiments of the present disclosure will be described below in detail with reference to the accompanying drawings, but not intended to limit the present disclosure.

In the description of the present disclosure, it should be understood that orientation or positional relationships indicated by the terms "on", "below" and the like are based on the orientation or positional relationships shown in the drawings, which is only for the convenience of describing the present disclosure and simplifying the description, rather than indication or implies that the device or component must have a specific orientation to a specific orientation configuration and operation, and therefore should not be construed as limiting the present disclosure. In addition, the terms "first" and "second" are only used for descriptive purposes and cannot be understood as indicating or implying relative importance or implicitly indicating the number of indicated technical features.

The present disclosure may repeat reference numbers and/or reference letters in different embodiments, such duplication is for the purpose of simplification and clarity, and by itself does not indicate the relationships between the various embodiments and/or settings discussed.

Referring to FIG. 1, a display panel 1000 is provided in an embodiment of the present disclosure. The display panel 1000 includes an array substrate 100, a color filter substrate 200, and liquid crystals (not show in figures). The liquid crystals are sandwiched between the color filter substrate 200 and the array substrate 100.

The array substrate 100 includes a first base 10, a first metal layer 20, a second metal layer 50, a third metal layer 90, and a fourth metal layer 70. The first metal layer 20 is disposed on the first base 10 and includes scanning lines 21. The second metal layer 50 is disposed on a side of the first metal layer 20 away from the first base 10 and includes data lines 51. The third metal layer 90 is disposed on a side of the second metal layer 50 away from the first metal layer 20 and includes pixel electrodes 91. The fourth metal layer 70 is disposed between the third metal layer 90 and the second metal layer 50, and includes a transparent shielding electrode 71. An orthographic projection of the transparent shielding electrode 71 on the first base 10 overlaps an orthographic projection of at least one of the data lines 51 and the scanning lines 21 on the first base 10. The transparent shielding electrode 71 is provided with at least one repair hole 711, and an orthographic projection of the repair hole 711 on the first base 10 overlaps a part of the orthographic projection of the at least one of the data lines 51 and the scanning lines 21 on the first base 10. That is, a part portion of the at least one of the data lines 51 and the scanning lines 21 can be correspondingly exposed from the repair hole 711.

Herein, the transparent shielding electrode 71 is provided to correspond to the data line 51 and/or the scanning line 21 and is provided with at least one repair hole 711 therein. When the data line 51 and/or the scanning line 21 need to be repaired by laser due to a condition therein, such as breakage, damage or the like, affecting electrical conductivity thereof, metal melt on a laser section may be formed in the repair hole 711. Thus, a probability of the metal melt contacting the transparent shielding electrode 71 is reduced, so that probability of a short circuit between the transparent shielding electrode 71 and the metal line such as the data line 51, the scanning line 21 or the like is reduced. Therefore, a repair yield of the array substrate 100 can be improved.

In an embodiment of the present disclosure, the orthographic projection of the transparent shielding electrode 71 on the first base 10 overlaps orthographic projections of the data lines 51 on the first base 10, and the orthographic projection of the at least one repair hole 711 on the first base 10 overlaps a part of orthographic projections of the data lines 51 on the first base 10. That is, part portions of the data lines 51 can be correspondingly exposed from the at least one repair hole 711.

In an embodiment of the present disclosure, the orthographic projection of the transparent shielding electrode 71 on the first base 10 overlaps orthographic projections of the scanning lines 21 on the first base 10, and the orthographic projection of the at least one repair hole 711 on the first base 10 overlaps a part of orthographic projections of the scanning lines 21 on the first base 10. That is, part portions of the scanning lines 21 can be exposed from corresponding repair hole 711.

In an embodiment of the present disclosure, the orthographic projection of the transparent shielding electrode 71 on the first base 10 overlaps orthographic projections of the data lines 51 and the scanning lines 21 on the first base 10, and the orthographic projection of the at least one repair hole 711 on the first base 10 overlaps a part of orthographic projections of the data lines 51 and the scanning lines 21 on the first base 10. That is, part portions of the data lines 51 and the scanning lines 21 can be exposed from corresponding repair hole 711.

In an embodiment of the present disclosure, a width of the data line 51 in a direction perpendicular to its extending direction is less than a width of the corresponding repair hole 711 in a same direction; and, a width of the scanning line 21 in a direction perpendicular to its extending direction is less than a width of the corresponding repair hole 711 in a same direction. In this way, when the data lines 51 and/or the scanning lines 21 are laser repaired, the probability of the metal melt on the laser section contacting the transparent shielding electrode 71 is further reduced, and the probability of short circuits between the transparent shielding electrode 71 and the data lines 51 and/or the scanning lines 21 is further reduced. Thus, the repair yield of the array substrate 100 can be further improved.

The data line 51 extends along a first direction X, the scanning line 21 extends along a second direction Y, and the array substrate 100 and the color filter substrate 200 are stacked along a third direction Z. The first direction X, the second direction Y, and the third direction Z define a coordinate system XYZ. The first direction X is perpendicular to the second direction Y, and the third direction Z is perpendicular to both of the first direction X and the second direction Y.

Figure 2:
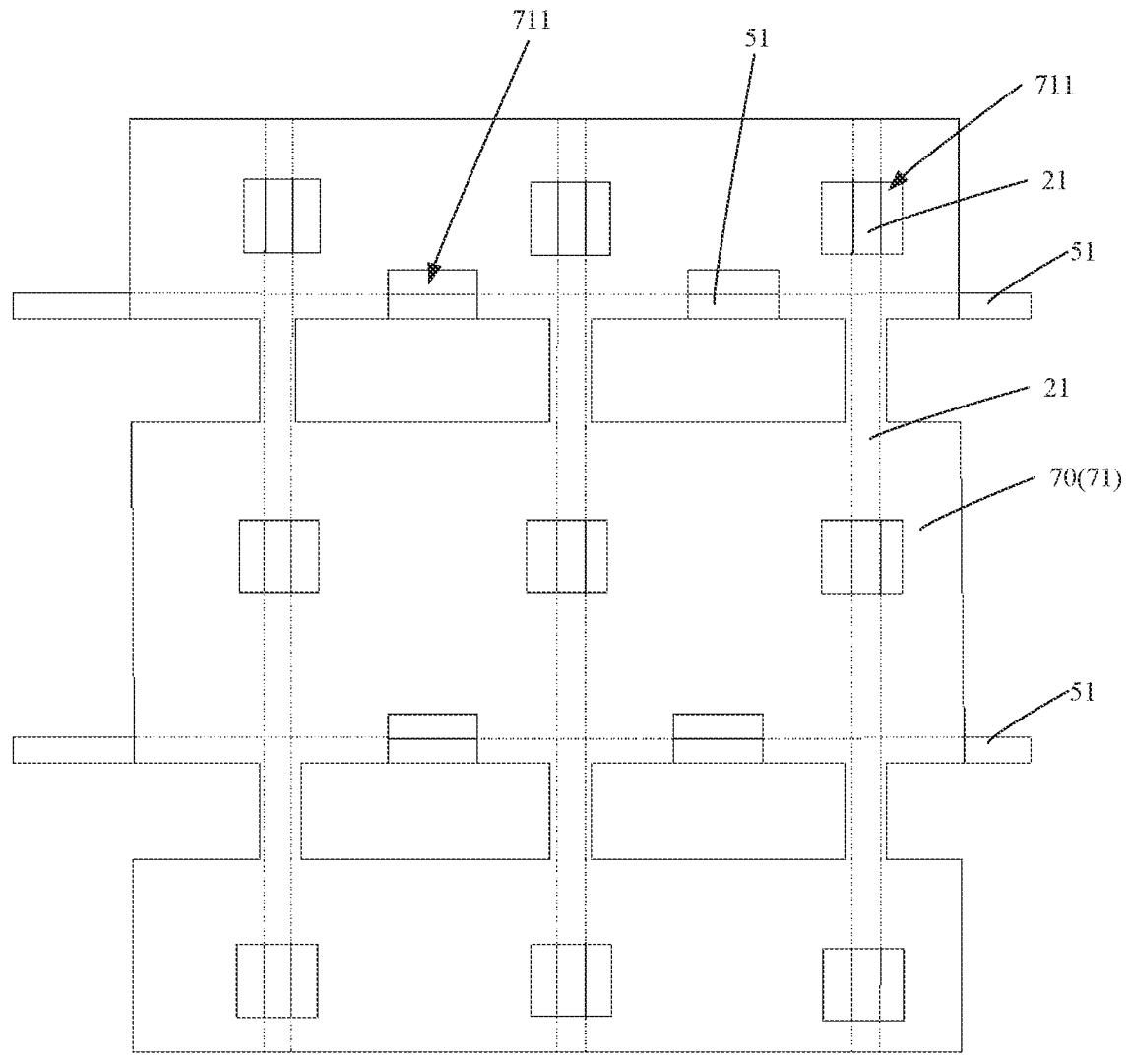
FIG. 2 is a top view of an array substrate (including data lines, scanning lines, and a transparent shielding electrode) of the display panel shown in FIG. 1.
Figure 3:
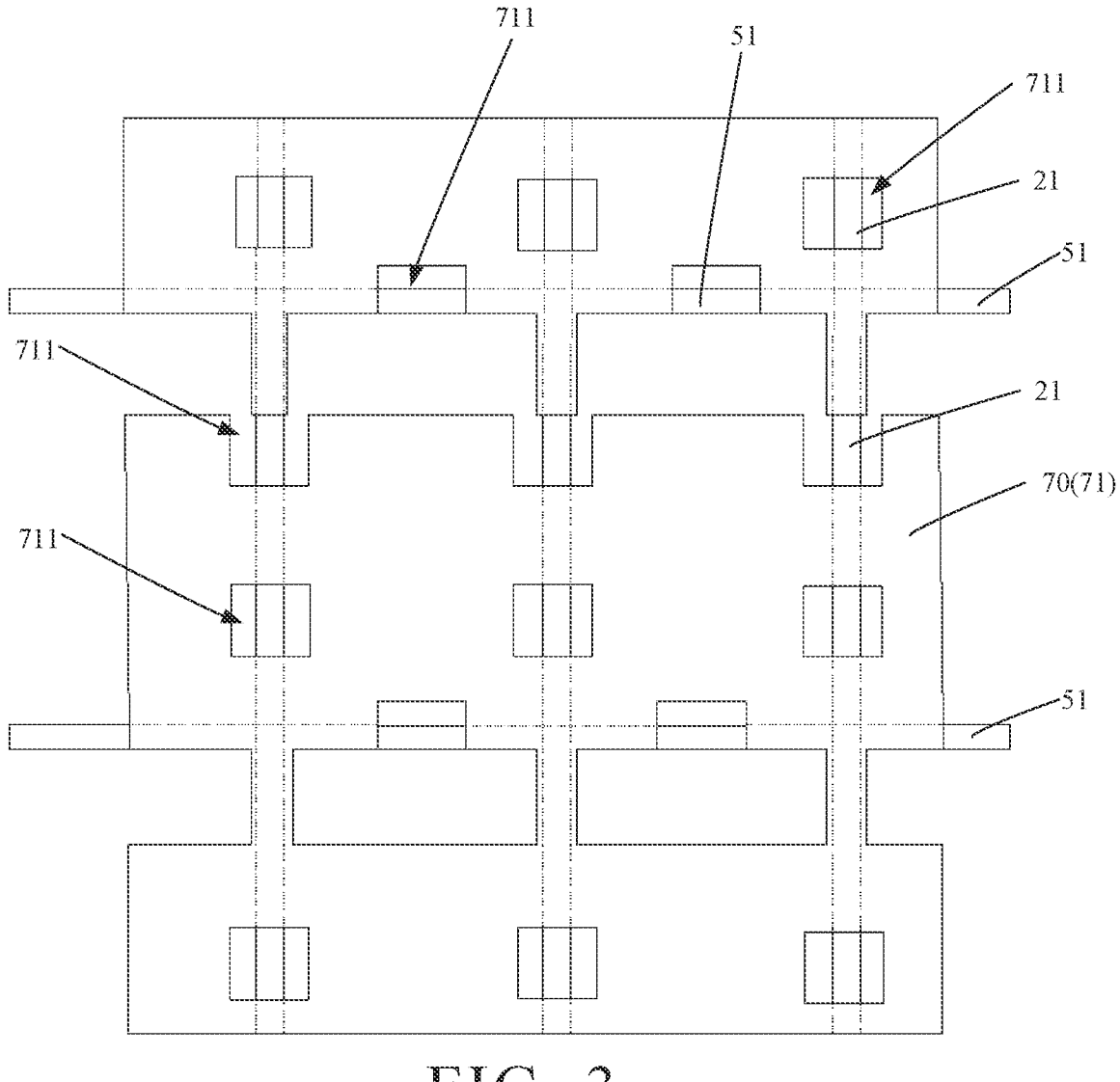
FIG. 3 is a top view of another array substrate (including data lines, scanning lines, and a transparent shielding electrode) of the display panel shown in FIG. 1.

Referring to FIG. 2 and FIG. 3, in an embodiment of the present disclosure, a subpixel area is defined and enclosed by two adjacent data lines 51 and two adjacent scanning lines 21. Each one of the data lines 51 and the scanning lines 21 enclosing a same subpixel area corresponds to at least one repair hole 711.

Specifically, referring to FIG. 2, in an embodiment of the present disclosure, one repair hole 711 is provided to be corresponding to each one of the data lines 51 and the scanning lines 21 enclosing a same subpixel area.

Specifically, referring to FIG. 3, in an embodiment of the present disclosure, one repair hole 711 is provided to be corresponding to each one of the data lines 51 enclosing a same subpixel area, and two repair holes 722 are provided to be corresponding to each one of the scanning lines 21 enclosing the same subpixel area. Certainly, in other embodiments, a number of the repair holes 711 provided to be corresponding to each one of the data lines 51 and/or the scanning lines 21 enclosing a same subpixel area is not limited to be two, but may be more than two. Compared to that one repair hole 711 is provided to be corresponding to each one of the data lines 51 and the scanning lines 21 enclosing the same subpixel area, that at least two repair holes 711 are provided to be corresponding to each one of the data lines 51 and the scanning lines 21 enclosing the same subpixel area may increase a selectivity of repair positions of the data lines and/or the scanning lines, so as to improve the repair yield.

In an embodiment of the present disclosure, among the data lines 51 and the scanning lines 21 enclosing a same subpixel area, a number of the repair holes 711 corresponding to one of the data lines 51 is less than a number of the repair holes 711 corresponding to the other one of the data lines 51, and/or a number of the repair holes 711 corresponding to one of the scanning lines 21 is less than a number of the repair holes 711 corresponding to the other one of the scanning lines 21.

In an embodiment of the present disclosure, among the data lines 51 and the scanning lines 21 enclosing a same subpixel area, a number of the repair holes 711 corresponding to the data line 51 is not equal to a number of the repair holes 711 corresponding to the scanning line 21. As illustrated in FIG. 3, the number of the repair holes 711 corresponding to the data line 51 may be less than a number of the repair holes 711 corresponding to the scanning line 21.

Of course, the number and locations of the repair holes 711 on each of the data lines 51 and each of the scanning lines 21 need to be set according to actual situations and are not limited to above examples.

Figure 4:
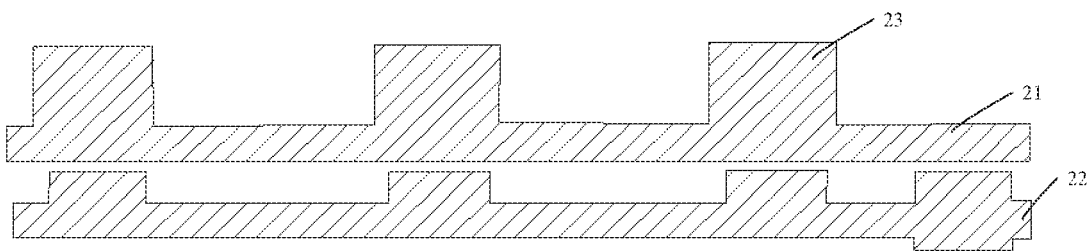
FIG. 4 is a sectional view of a first metal layer shown in FIG. 1.
Figure 5:
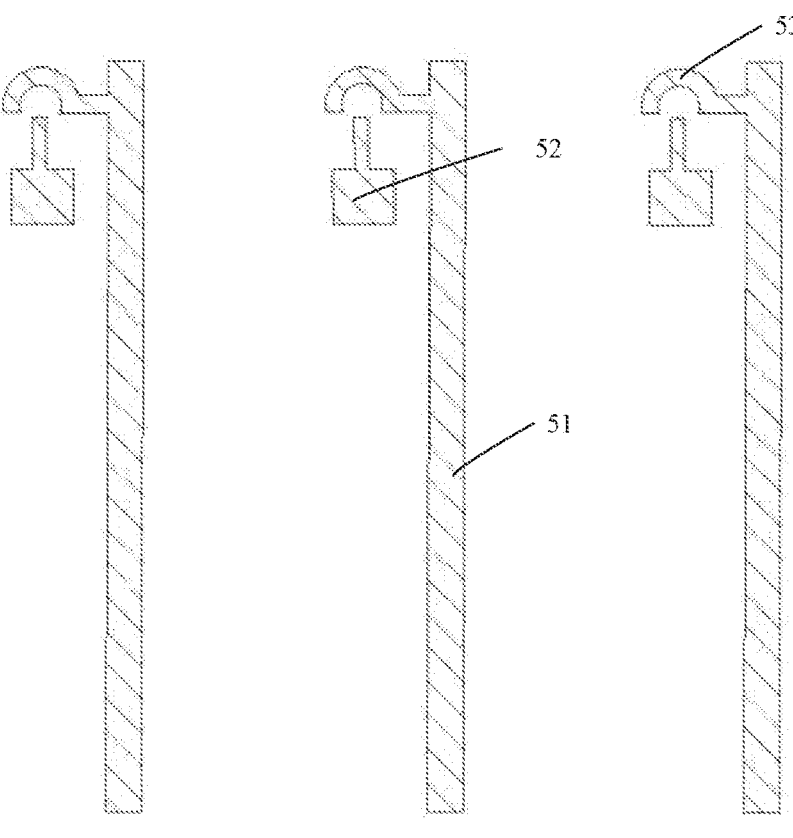
FIG. 5 is a sectional view of a second metal layer shown in FIG. 1.

Referring to FIG. 1, FIG. 4, and FIG. 5, in an embodiment of the present disclosure, the first metal layer 20 further includes a common signal line 22 and gates 23. The common signal line 22, the scanning lines 21, and the gates 23 are arranged in a same layer. An extending direction of the common signal line 22 is same with the extending direction of the scanning line 21. The gates 23 are electrically connected to the scanning lines 21.

The second metal layer 50 further includes sources 52 and drains 53 disposed at intervals. The sources 52 are electrically connected to the data lines 51. The sources 52 and the drains 53 are correspondingly opposite to the gates 23. The array substrate 100 further includes an active layer 40 disposed at a side of the gate 23. The array substrate 100 further includes a plurality of transistors. Each of the transistors includes one of the gates 23, the active layer 40, and one of the sources 52 and one of the drains 53 corresponding to the gate 23 and the active layer 40. The pixel electrodes 91 are electrically connected to the drains 53. Data signals from the data lines 51 successively enter the sources 52, the drains 53, and the pixel electrodes 91.

Referring to FIG. 1, in an embodiment of the present disclosure, the third metal layer 90 further includes a connecting electrode 92. The connecting electrode 92 is electrically connected to the transparent shielding electrode 71 and is electrically connected to the common signal line 22. A common signal from the common signal line 22 successively enters the connecting electrode 92 and the transparent shielding electrode 71.

The connecting electrode 92 is electrically connected to the transparent shielding electrode 71 through a first connecting hole 94 and is electrically connected to the common signal line 22 through a second connecting hole 95. The pixel electrodes 91 is electrically connected to the drains 53 through third connecting holes 93.

Specifically, referring to FIG. 1, in an embodiment of the present disclosure, the first connecting hole 94 and the second connecting hole 95 are spaced from each other. In other embodiment of the present disclosure, the first connecting hole 94 and the second connecting hole 95 may be communicated with each other (not shown in figures). Of course, when the first connecting hole 94 and the second connecting hole 95 are communicated with each other, a bottom cutting structure may be formed at a connecting position of the first connecting hole 94 and the second connecting hole 95, and there is a breaking risk at the bottom cutting structure. That the first connecting hole 94 and the second connecting hole 95 are spaced from each other can avoid the bottom cutting structure, so as to avoid the breaking risk.

In an embodiment of the present disclosure, the array substrate 100 further includes a color resist layer 62 and a passivation layer 61. The passivation layer 61 disposed between the second metal layer 50 and the color resist layer 62. The color resist layer 62 is disposed between the passivation layer 61 and the fourth metal layer 70. A part of the fourth metal layer 70 is further formed on a part of the passivation layer 61.

Specifically, referring to FIG. 1, in an embodiment of the present disclosure, orthographic projections of the first connecting hole 94 and the second connecting hole 95 on the first base 10 are outside an orthographic projection of the color resist layer 62 on the first base 10.

The color resist layer 62 may include a plurality of color resist blocks disposed at intervals. In the embodiment, the color resist blocks are red color resist blocks, green color resist blocks, and blue color resist blocks.

In an embodiment of the present disclosure, the orthographic projections of the first connecting hole 94 and the second connecting hole 95 on the first base 10 are within the orthographic projection of the color resist layer 62 on the first base 10.

Specifically, because a transmittance of the blue color resist block is less than a transmittance of the red color resist block and is less than a transmittance of the green color resist block, the orthographic projections of the first connecting hole 94 and the second connecting hole 95 on the first base 10 may also be designed to be within orthographic projections of the blue color resist blocks on the first base 10. In this way, an opening rate corresponding to the blue color resist blocks may be increased, so as to increase a transmittance of the color resist layer 62. Of course, the orthographic projections of the first connecting hole 94 and the second connecting hole 95 on the first base 10 may be within the orthographic projections of the red color resist blocks and the green color resist blocks on the first base 10.

In an embodiment of the present disclosure, the first connecting hole 94 and the second connecting hole 95 may be corresponding to different blue color resist blocks, or may be corresponding to a same blue color resist block. The first connecting hole 94 and the second connecting hole 95 may be corresponding to two blue color resist blocks of adjacent two pixels, or may be corresponding to two blue color resist blocks of two non-adjacent pixels. The two blue color resist blocks of two non-adjacent pixels may be two blue color resist blocks of two pixels in a same row, or may be two blue color resist blocks of two pixels in different rows.

Referring to FIG. 1, the array substrate 100 further includes a planarization layer 80 and a gate insulation layer 30. The planarization layer 80 is formed on the color resist layer 62 and coats the fourth metal layer 70 and parts of the passivation layer 61. The gate insulation layer 30 is formed on the first base 10 and coats the first metal layer 20. The active layer 40 is formed on the gate insulation layer 30. The passivation layer 61 further coats parts of the gate insulation layer 30. The third connecting hole 93 passes through the planarization layer 80 and the passivation layer 61. The first connecting hole 94 passes through the planarization layer 80. The second connecting hole 95 passes through the planarization layer 80, the passivation layer 61, and the gate insulation layer 30.

The color filter substrate 200 includes a second base 201, a patterned black matrix 202 formed on the second base 201, and a common electrode 203 formed on the second base 201 and coating the black matrix 202. The common electrode 203 faces the pixel electrodes 91.

Figure 6:
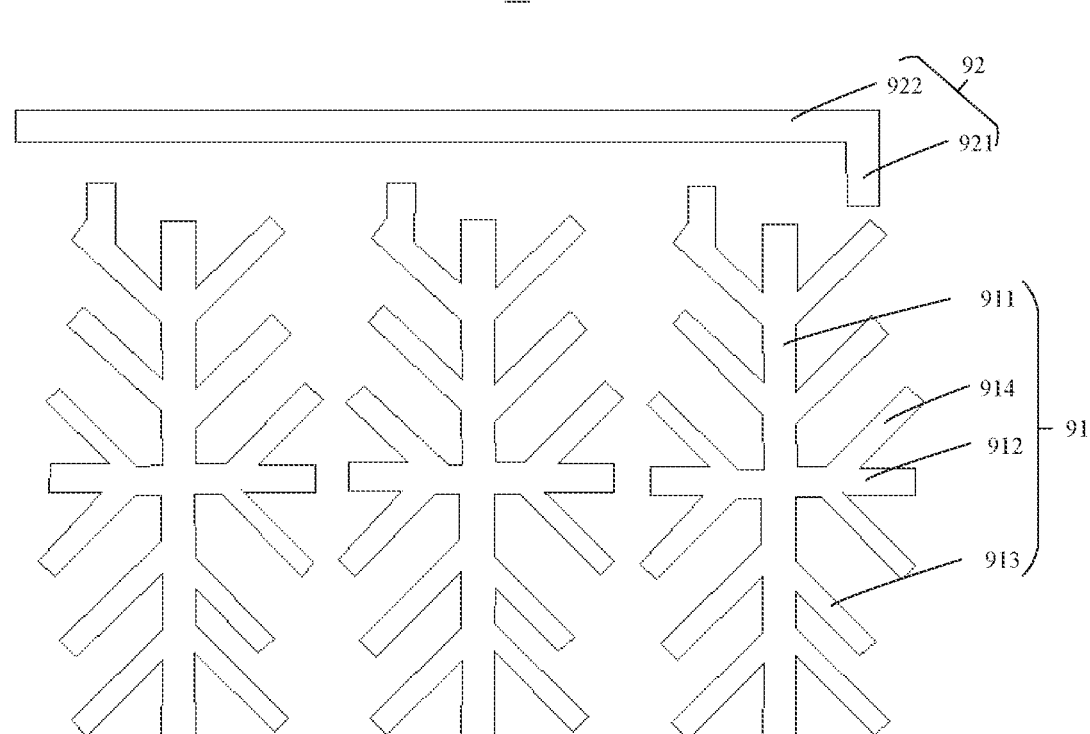
FIG. 6 is a sectional view of a third metal layer shown in FIG. 1.

Referring to FIG. 6, in an embodiment of the present disclosure, the pixel electrode 91 includes a first trunk portion 911, a second trunk portion 912, first branch portions 913 and second branch portions 914. The first trunk portion 911 and the second trunk portion 912 are crossed and arranged in a shape of a Chinese character "+". A plurality of the first branch portions 913 are inclined to be fixed on the first trunk portion 911, and a plurality of the second branch portion 914 are inclined to be fixed on the second trunk portion 912. The plurality of the first branch portion 913 are extend out along directions away from the second trunk portion 912, and the plurality of the second branch portion 914 are extend out along directions away from the first trunk portion 911. In the embodiment, a domain number of the pixel electrode 91 is four. Extending directions of the first branch portions 913 and the second branch portions 914 in a same domain are same. In other embodiments, the domain number of the pixel electrodes 91 is not limited to four, but can also be other. A shape of the pixel electrode 91 is also not limited to the above shape.

The connecting electrode 92 includes a first connecting portion 921 and a second connecting portion 922. The first connecting portion 921 corresponds to the first connecting hole 94 and/or the second connecting hole 95. The first connecting portion 921 is electrically connected to the transparent shielding electrode 71, and/or is electrically connected to the common signal line 22. The second connecting portion 922 is connected to the first connecting portion 921 and covers the scanning lines 21.

The pixel electrodes 91 and the connecting electrode 92 are transparent. Materials of the pixel electrodes 91 and the connecting electrode 92 are indium tin oxide (ITO for short). Of course, the materials of the pixel electrodes 91 and the connecting electrode 92 are not limited to ITO, but can also be other transparent electrode materials.

In the array substrates and the display panels according to one or more embodiments of the present disclosure, at least one repair hole is formed in the transparent shielding electrode corresponding to the data line and/or the scanning line. When the data line and/or the scanning line need to be repaired by laser due to a condition therein, such as breakage, damage or the like, affecting electrical conductivity thereof, metal melt on a laser section can be formed in the repair hole. Thus, probability of the metal melt contacting the transparent shielding electrode is reduced, so that probability of a short circuit between the transparent shielding electrode and the metal line such as the data line, the scanning line or the like is reduced. Therefore, the repair yield of the metal line in the array substrate can be improved.

Some embodiments have been described above to illustrate the present disclosure, but not intended to limit the present disclosure. Those skilled in the art may make various changes and modifications without departing from the spirit and scope of the present disclosure. Therefore, the scope of the present disclosure is defined by the appended claims.

What is claimed is:

1. An array substrate, comprising:
a first base;
a first metal layer, disposed on the first base and comprising scanning lines;
a second metal layer, disposed on a side of the first metal layer and comprising data lines;
a third metal layer, disposed on a side of the second metal layer away from the first metal layer and comprising pixel electrodes; and
a fourth metal layer, disposed between the third metal layer and the second metal layer and comprising a transparent shielding electrode,
wherein one or more repair holes are formed in the transparent shielding electrode, a first orthographic projection of each of the one or more repair holes on the first base overlaps a part of a second orthographic projection of at least one line of the data lines and the scanning lines on the first base, and a third orthographic projection of the transparent shielding electrode on the first base overlaps the second orthographic projection.

2. The array substrate of claim 1, wherein each repair hole of the one or more repair holes has a size, in a direction perpendicular to an extending direction of the line of the data lines and the scanning lines overlapped with the repair hole, greater than a width of the line.

3. The array substrate of claim 1, wherein every two adjacent data lines of the data lines and every two adjacent scanning lines of the scanning lines define a subpixel area, and in the subpixel area, at least one repair hole of the one or more repair holes is provided corresponding to each one of the two adjacent data lines and the two adjacent scanning lines.

4. The array substrate of claim 3, wherein, in the subpixel area, one repair hole of the one or more repair holes is provided corresponding to each one of the two adjacent data lines and the two adjacent scanning lines.

5. The array substrate of claim 3, wherein, in the subpixel area, at least two repair holes of the one or more repair holes are provided corresponding to each one of the two adjacent data lines and the two adjacent scanning lines.

6. The array substrate of claim 3, wherein, in the subpixel area, in the subpixel area, a number of repair holes of the repair holes corresponding to one of the two adjacent data lines is less than a number of repair holes of the repair holes corresponding to the other one of the two adjacent data lines.

7. The array substrate of claim 3, wherein, in the subpixel area, a number of repair holes of the repair holes corresponding to one of the two adjacent scanning lines is less than a number of repair holes of the repair holes corresponding to the other one of the two adjacent scanning lines.

8. The array substrate of claim 3, wherein, in the subpixel area, a number of repair holes of the repair holes corresponding to one of the two adjacent data lines is less than a number of repair holes of the repair holes corresponding to the other one of the two adjacent data lines, and a number of repair holes of the repair holes corresponding to one of the two adjacent scanning lines is less than a number of repair holes of the repair holes corresponding to the other one of the two adjacent scanning lines.

9. The array substrate of claim 3, wherein a first number of repair holes of the one or more repair holes are provided corresponding to each one of the two adjacent data lines, a second number of repair holes of the one or more repair holes are provided corresponding to each one of the two adjacent scanning lines, and the first number being not equal to the second number.

10. The array substrate of claim 1, wherein the one or more repair holes comprises a plurality of repair holes; the transparent shielding electrode overlaps the data lines and the scanning lines; and
orthographic projections of some of the plurality of repair holes on the first base overlaps part of orthographic projections of the data lines on the first base, and orthographic projections other some of the plurality of repair holes on the first base overlaps part of orthographic projections of the scanning lines on the first base.

11. The array substrate of claim 1, wherein the first metal layer further comprises common signal lines and gates, and the gates are electrically connected to the scanning lines;
the second metal layer further comprises sources and drains, the sources are electrically connected to the data lines, the sources and the drains are correspondingly opposite to the gates, and the drains are electrically connected to the pixel electrodes;
the third metal layer further comprises connecting electrodes electrically connecting the transparent shielding electrode and the common signal lines; and
data signals from the data lines are capable of successively entering the sources, the drains, and the pixel electrodes, and common signals from the common signal lines are capable of successively entering the connecting electrodes and the transparent shielding electrode.

12. The array substrate of claim 11, wherein each of the connecting electrodes is electrically connected to the transparent shielding electrode through a first connecting hole and electrically connected to one of the common signal lines through a second connecting hole.

13. The array substrate of claim 12, wherein the first connecting hole is spaced apart from the second connecting hole.

14. The array substrate of claim 12, wherein the first connecting hole communicates with the second connecting hole.

15. The array substrate of claim 11, further comprising a color resist layer and a passivation layer, wherein the passivation layer is disposed between the second metal layer and the color resist layer, the color resist layer is disposed between the passivation layer and the fourth metal layer, and orthographic projections of the first connecting hole and the second connecting hole on the first base are outside an orthographic projection of the color resist layer on the first base.

16. The array substrate of claim 11, further comprising a color resist layer and a passivation layer, wherein the passivation layer is disposed between the second metal layer and the color resist layer, the color resist layer is disposed between the passivation layer and the fourth metal layer, and orthographic projections of the first connecting hole and the second connecting hole on the first base are within an orthographic projection of the color resist layer on the first base.

17. A display panel, comprising:
an array substrate, comprising:
 a first base;
 a first metal layer, disposed on the first base and comprising scanning lines;
 a second metal layer, disposed on a side of the first metal layer and comprising data lines;
 a third metal layer, disposed on a side of the second metal layer away from the first metal layer and comprising pixel electrodes; and
 a fourth metal layer, disposed between the third metal layer and the second metal layer and comprising a transparent shielding electrode;
a color filter substrate; and
a liquid crystal, sandwiched between the array substrate and the color filter substrate, wherein one or more repair holes are formed in the transparent shielding electrode, a first orthographic projection of each of the one or more repair holes on the first base overlaps a part of a second orthographic projection of at least one line of the data lines and the scanning lines on the first base, and a third orthographic projection of the transparent shielding electrode on the first base overlaps the second orthographic projection.

18. The display panel of claim 17, wherein each repair hole of the one or more repair holes has a size, in a direction perpendicular to an extending direction of the line of the data lines and the scanning lines overlapped with the repair hole, greater than a width of the line.

19. The display panel of claim 17, wherein every two adjacent data lines of the data lines and every two adjacent scanning lines of the scanning lines define a subpixel area, and in the subpixel area, at least one repair hole of the one or more repair holes is provided corresponding to each one of the two adjacent data lines and the two adjacent scanning lines.

20. The display panel of claim 19, wherein a first number of repair holes of the one or more repair holes are provided corresponding to each one of the two adjacent data lines, a second number of repair holes of the one or more repair holes are provided corresponding to each one of the two adjacent scanning lines, and the first number being not equal to the second number.

* * * * *